United States Patent [19]
Boyette, Jr. et al.

[11] Patent Number: 5,543,726
[45] Date of Patent: Aug. 6, 1996

[54] OPEN FRAME GANTRY PROBING SYSTEM

[75] Inventors: James E. Boyette, Jr., Delray Beach; Jiann-Chang Lo, Lantana; Michael Servedio, Boca Raton, all of Fla.

[73] Assignee: International Business Machines Corporation, Armonk, N.Y.

[21] Appl. No.: 176,810

[22] Filed: Jan. 3, 1994

[51] Int. Cl.⁶ .................................................. G01R 31/02
[52] U.S. Cl. ....................... 324/758; 324/158.1; 324/757
[58] Field of Search .................................. 324/754, 761, 324/73.1, 158.1, 758, 757, 72.5

[56] References Cited

U.S. PATENT DOCUMENTS

| | | | |
|---|---|---|---|
| 4,155,173 | 5/1979 | Sprandel | 33/503 |
| 4,471,298 | 9/1984 | Frohlich | 324/757 |
| 4,786,867 | 11/1988 | Yamatsu | 324/758 |
| 4,864,227 | 9/1989 | Sato | 324/758 |
| 4,934,064 | 6/1990 | Yamaguchi et al. | 33/645 |
| 4,943,767 | 6/1990 | Yakota | 324/758 |
| 4,945,501 | 7/1990 | Bell et al. | 364/571.05 |
| 4,958,437 | 9/1990 | Helms | 33/503 |
| 4,992,728 | 2/1991 | McCord et al. | 324/758 |
| 5,042,162 | 8/1991 | Helms | 33/503 |
| 5,091,692 | 2/1992 | Ohno et al. | 324/758 |
| 5,107,206 | 4/1992 | Yanagi et al. | 324/754 |
| 5,113,132 | 5/1992 | Hoshi | 324/758 |

OTHER PUBLICATIONS

Flynn et al; "Automated Printed Circuits . . ."; IBM Tech. Dis. Bull.; vol. 14; No. 12; May 1972; pp. 3623–3624.

Primary Examiner—Ernest F. Karlsen
Attorney, Agent, or Firm—Romualdas Strimaitis; Anthony N. Magistra; Ronald V. Davidge

[57] ABSTRACT

A system for probing both sides of a high density printed circuit board includes an open frame extending around the circuit board when it is held in a test position by a circuit board carrier. The frame includes two parallel rail structures extending above, and at opposite ends of, the circuit board in the test position. The frame also includes another two parallel rail structures extending below, and at opposite ends of, the circuit board. The upper and lower rail structures extend perpendicularly to one another, and are fastened together at the corners of the frame by means of compression bolt assemblies. Two gantry structures are moved in a first direction between the upper rail structures, while two other gantry structures are moved in a direction perpendicular to the first direction between the lower rail structures. A carriage moves along each gantry structure, and a probe is mounted on each carriage to be moved toward and away from the adjacent surface of the circuit board. The circuit board is moved by a board carrier between a position, outside the frame, in which it is loaded and unloaded, and the test position.

20 Claims, 5 Drawing Sheets

OPEN FRAME GANTRY PROBING SYSTEM

BACKGROUND OF THE INVENTION

1. Field of the Invention

This invention relates to test apparatus for probing electronic circuit boards, and more particularly, to test apparatus for simultaneously probing both sides of a fine pitch electronic circuit board.

2. Background Information

Test procedures applied to fine-pitch electronic circuit boards, such as multi-chip modules and multi-layer ceramic substrates, include bringing one or more probes into physical contact with individual circuits on the board. This is typically done using a cluster prober with a number of simultaneously engaged probe contacts in a fixed relationship, or using a serial prober moving one or more independent probes in a data driven fashion using map data. The cluster prober less flexible and requires a large capital investment for a custom probe head for each product type. While a serial prober can position probes to handle a variety of products easily, the use of such a device for highly dense circuit boards requires additional time. Since a large number of circuits must be checked in a dense board, the probe must move rapidly between test points. Probing should be done as quickly as possible to minimize the number of testers required to handle the output of a manufacturing line.

Probing at high speeds puts special demands on the probing system. Since the features to be probed are very small, great accuracy is required of the probing system. If the system structure vibrates excessively due to the acceleration forces which must be applied to move the various stages of the prober, the accuracy of the system may be affected. Furthermore, the product being tested may be damaged if the probe tip continues to vibrate during the test. Because of the high operational speeds and usage rates of this type of test equipment, an ability to perform maintenance operations rapidly and efficiently is an important factor in reducing operating costs of the test process and in increasing the availability of the test equipment. An important example of the type of maintenance which must be performed frequently is the replacement of probe tips.

Since complex circuits typically extend along both sides of a fine-pitch electronic circuit board, the ability to probe both sides of the board rapidly, accurately, and simultaneously is becoming increasingly important. While systems capable of probing both sides of the circuit board are becoming available, a particular need exists for a probing system which can probe both sides of the circuit board being tested, while providing the flexibility of a serial prober, while facilitating the installation and removal of circuit boards to be tested, and while providing physical access to the probing system for maintenance functions.

DESCRIPTION OF THE PRIOR ART

A number of examples may be found in the patent art regarding test devices for probing high-density circuits. For example, U.S. Pat. Nos. 4,786,867 to Yamatsu, 4,934,064 to Yamaguchi et al, and 5,091,692 to Ohno et al describe ways of locating probes relative to the surface of a high density circuit. However, these methods are applied to probes operating on a single, upward-facing surface of the test circuit board. With the probes operating on only one side of the circuit board, access is generally only needed from above, with a solid structure, such as a table extending below the probes and the circuit board. Again, what is needed is a structure and mechanism allowing the operation of probes on both sides of the circuit while providing for ease of loading of the circuits to be tested and while facilitating the maintenance tasks necessary to keep the prober functioning properly.

Apparatus providing for the movement of a probe with great accuracy and minimal vibration, and for electronically sensing the location of the probe as is it moved, may be found in the patent art associated with coordinate measuring machines, which are used to determine the location of a probe brought against a work surface to be measured. The use of a gantry-type support structure in a coordinate measuring machine is shown, for example, in U.S. Pat. No. 4,958,437 to Helms. A probe for making mechanical measurements is mounted to travel in three directions above the surface of a solid table. The probe is mounted at the end of a vertically slidable Z-rail extending downward from a carriage, which is in turn slidably mounted to travel along a gantry structure. The gantry structure itself is mounted, through the use of air bearings, to travel on rails extending along the sides of the solid table, in a direction perpendicular to the motion of the carriage on the gantry structure. The gantry structure is moved by a drive fastened at one side of the structure. A vibration damper, preferably spaced away from the point at which the drive is attached, includes a substantial mass suspended from the gantry structure by highly energy absorbent pads having a low rebound resistance.

A coordinate measuring machine of this type is used to make rectangular coordinate measurements of various mechanical features of a part lying on, or clamped to, the table, which is typically a solid granite block. There is no need to get to the underside of the part being measured; and no provision is made to do so. While the application of a coordinate measuring machine is similar to the application of a circuit prober in that a high level of accuracy is required, a practical circuit prober must operate at much greater speeds than a coordinate measuring machine.

SUMMARY OF THE INVENTION

In accordance with one aspect of the invention, there is provided apparatus moving probing devices along opposite sides of a circuit board under test, in which the apparatus includes a support structure, first, second, third, and fourth rail structures, first and second gantry structures, a gantry drive mechanism, and a probe mounted on each of the first and second gantry structures. The support structure has a circuit board receiving slot and a circuit board holding mechanism for holding the circuit board within the circuit board receiving slot with a first side of the circuit board exposed in a first direction and with a second side of the circuit board, opposite the first side, exposed in a second direction. The first rail structure extends along a first side of the circuit board receiving slot, fastened to the support structure to extend from the support structure in the first direction. The second rail structure, which extends along a side of the circuit board receiving slot opposite the first side of this slot, extends parallel to the first rail structure, fastened to extend from the support structure in the first direction. The third rail structure, which extends along a second side of the card receiving slot, is fastened to the support structure to extend from the support structure in the second direction. The fourth rail structure, which extends parallel to the third rail structure, is fastened to the support structure to extend from the support structure in the second direction. The first gantry structure is movable between and along the first and second rail structures. The second gantry structure is movable between and along the third and fourth rail structures. The gantry drive mechanism moves the first and second gantry structures. Each probe moves toward and away from a circuit board held within the circuit board holding mechanism.

BRIEF DESCRIPTION OF THE DRAWINGS

One preferred embodiment of the subject invention is hereafter described with specific reference being made to the following FIGS., in which.

DETAILED DESCRIPTION

The open frame gantry probing system of the present invention is designed to meet needs for high performance and minimum levels of vibration while providing easy access during operation and maintenance. The gantry configuration is chosen so that large product sizes can be accommodated without a loss of performance due to the flexure of a cantilever support.

Figure 1:
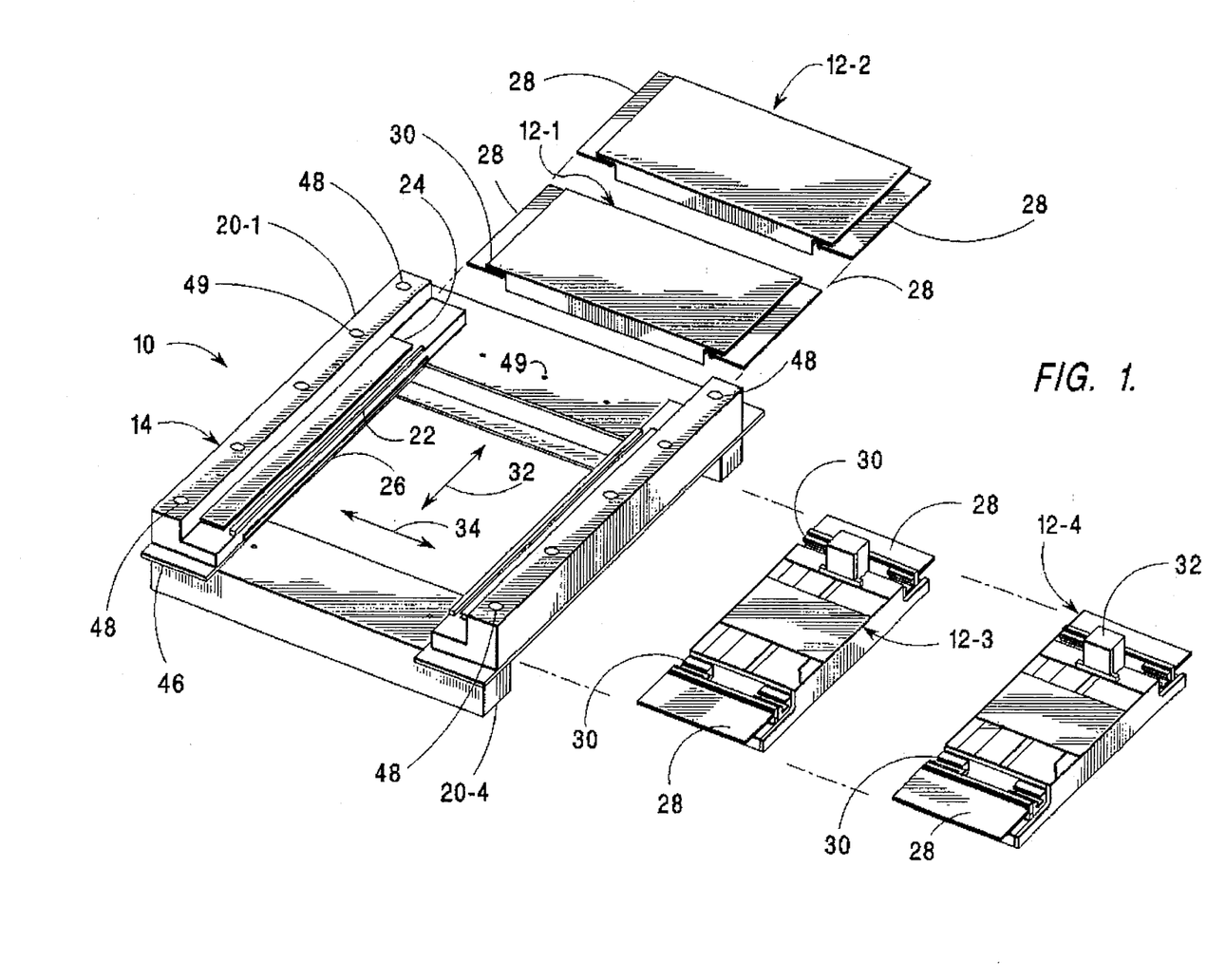
FIG. 1 is an exploded view of an open frame gantry probing system built in accordance with the present invention, showing the major components thereof.

Referring to FIG. 1, an open frame gantry probing system 10 includes four independent gantry structures 12, each of includes functions as an XY stage. Upper gantry structures 12-1 and 12-2 carry probes for use along the upper surface of the product being tested (not shown), while lower gantry structures 12-3 and 12-4 carry probes for use along the lower surface of the product being tested. A frame 14 includes two upper granite beams 20-1 and 20-2, along with two lower granite beams 20-3 and 20-4. A linear bearing rail 22 and a linear motor magnet channel 24 are attached to each granite beam 20. An encoder scale 26 is attached to an upper granite beam 20-1 and to a lower granite beam 20-3. Each gantry structure 12 includes at each end a linear motor coil 28, operating within a corresponding linear motor magnet channel 24, and a pair of recirculating ball bearings 30, engaging the corresponding linear bearing rail 22. Each gantry structure 12 further includes at one end an encoder read head 32 carried in close proximity to a corresponding encoder scale 26.

In each of the upper and lower portions of system 10, the X-axis is defined by the direction in which the granite beams 20 extend to permit motion of the gantry structures 12 travelling thereon. Thus the X-axis of the upper portion of the system is defined by beams 20-1 and 20-2 to lie in the direction indicated by arrow 32, while the X-axis of the lower portion of the system is defined by beams 20-3 and 20-4 to lie in the direction indicated by arrow 34.

Figures 2, 3:
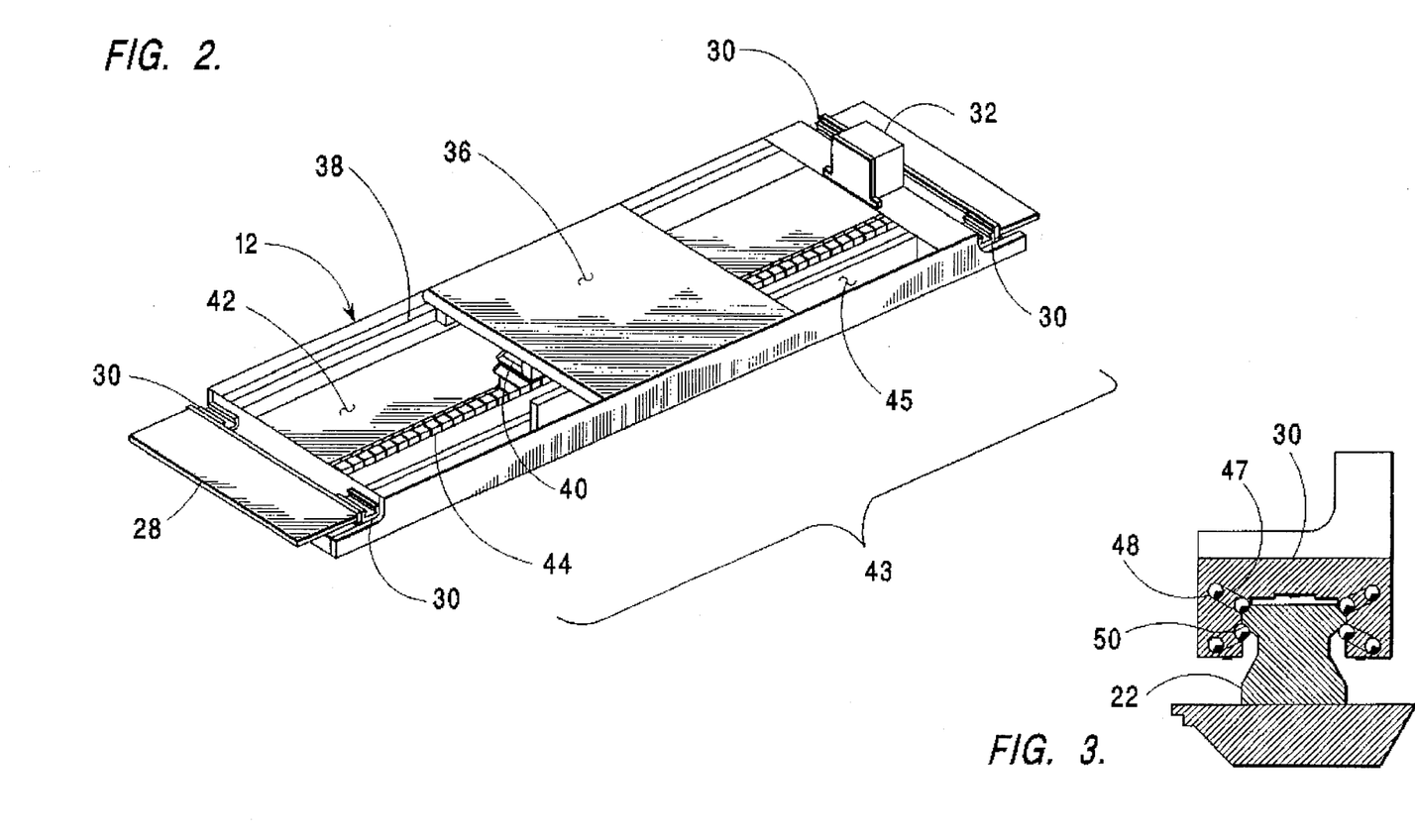
FIG. 2 is a view of a single gantry structure of the probing system of FIG. 1, showing particularly a lower gantry as viewed from above.
FIG. 3 is a transverse cross-sectional elevation of one of the bearings of the gantry structure of FIG. 2, taken as indicated by section lines II—II in FIG. 2.

Referring to FIG. 2, on each gantry structure 12, probe motion in the Y-direction is independently derived through movement of a carriage 36 along carriage rails 38, under control of a linear motor coil 40 extending into a linear motor magnet channel 42. Magnet channel 42 includes, on each side, a row of permanent magnets 44, arranged with alternating polarities at their ends. The carriage 36 is in the form of an aluminum extrusion, running on the rails 38 with low-friction recirculating bearings, which are mounted in an almost square configuration. The position of carriage 36 on gantry structure 12 is tracked by an encoder read head (not shown), attached to the carriage 36 to move in close proximity to an encoder scale 45 mounted in the gantry structure 12.

The central portion 43 of each gantry structure 20 may consist, for example of an Anorad LW-10 stage, available from Anorad Corporation of Hauppage, N.Y., with modifications being applied to the ends of the stage to provide various mechanisms associated with movement of the entire gantry structure 20, such as linear motor coils 28, recirculating ball bearings 30, and encoder read head 32. Thus, a linear motor including coil 40 and magnet channel 42, cabling limits, and stops are provided as integral parts of the stage forming central portion 43.

Referring again to FIG. 1, the four granite beams 20 together form frame 14 as the four sides of a box structure. A "U"-shaped metal support plate 46, fastened between the upper pair of granite beams 20-1 and 20-2, and the lower pair of granite beams 20-3 and 20-4, provides support for the product being tested. Granite beams 20 and support plate 46 are attached at each corner by a compression bolt assembly 48 extending therethrough to provide maximum stiffness, and additional compression bolt assemblies 49 attach the granite beams 20 to support plate 46 at intermediate positions. This arrangement provides mechanical support in all directions within an open configuration, wherein all critical components are easily accessible, and wherein the product is visible in its test position.

While individual components of the gantry structure drive mechanism, such as linear motor coils 28, may be of types similar to corresponding carriage drive parts, such as linear motor coils 40, because of the mass and length of gantry structures 12, and because it is undesirable to have drive components extending centrally from the gantry structures in the direction in which they are moved, separate motor coils 28 are powered at each end of the gantry structure 12. However, only one encoder read head 32 is required for each gantry structure 12. Furthermore, both encoder read heads 32 of upper gantry structures 12-1 and 12-2 use the same encoder scale 26 on upper granite beam 20-1, while both encoder read heads 32 of lower gantry structures 12-3 and 12-4 use the same encoder scale 26 on lower granite beam 20-3.

FIG. 3 provides a transverse cross-sectional elevation of one of the bearings 30, together with an associated rail 22. Bearing 30 includes four grooves 47, in which balls 48 are allowed to circulate with motion of the bearing on the rail. The rail 22 includes four longitudinally extending grooves 50 in which balls 48 roll. Linear motion support systems of this kind are available from THK Co., Ltd., of Tokyo, Japan, as LM systems.

Figure 4:
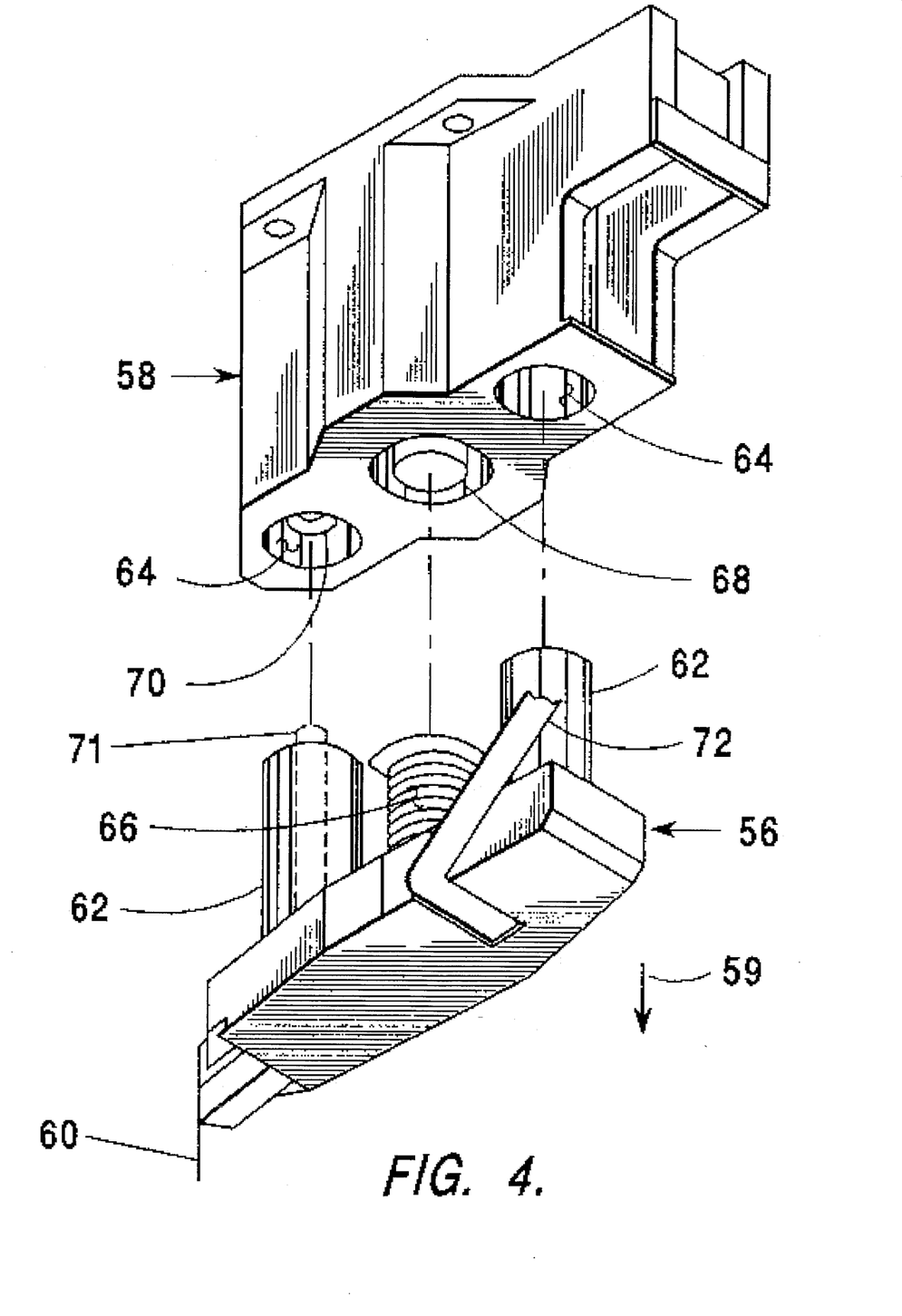
FIG. 4 is an exploded isometric view of a probe assembly and an associated carrier of the probing system of FIG. 1, showing particularly a lower probe as viewed from above.

FIG. 4 provides an exploded view of a probe assembly 56 and an associated probe carrier 58 carried by each of the four carriages 36 (shown in FIGS. 1 and 2). This FIG. specifically shows an example a structure oriented for attachment to an upper carriage of gantry structure 12-1 or 12-2, as viewed from below. Probe assembly 56 moves in the direction of arrow 59 to bring probe tip 60 into contact with a point on the test circuit. After an individual point is probed, probe assembly 56 is moved opposite the direction of arrow 59 to bring probe tip 60 out of contact with the test circuit. This movement occurs as sapphire shafts 62 of probe assembly 56 slide within air bearings 64 of probe carrier 58. Movement of the probe assembly 56 occurs as an electrical current is applied to a coil 66, which extends over a permanent magnet formed as a central post 68. The position of probe assembly 56 within carrier 58 is sensed by a displacement transducer, such as an LVDT transformer 70, operating with a sliding core 71. Electrical connections to probe tip 60 and coil 66 are made through a flexible cable 72.

Figure 5:
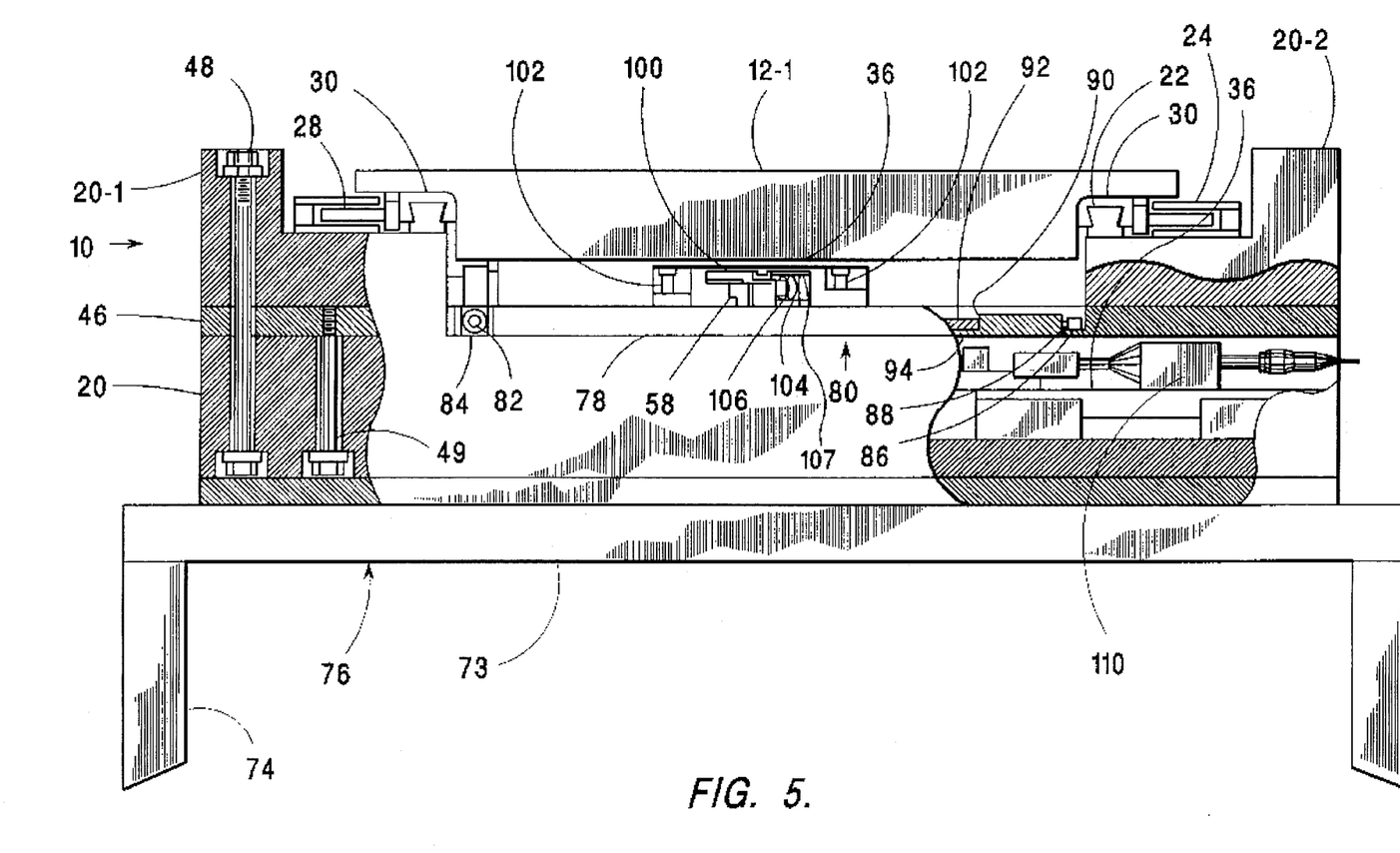
FIG. 5 is a front elevational view of the probing system of FIG. 1.

Referring to the front elevational view of FIG. 5, lower granite beams 20-3 and 20-4 rest on a table plate 73 of a base structure 74, with four corner legs 76 extending downward to hold the probing system 10 at a convenient height from a floor surface (not shown). Table plate 73 preferably includes a central aperture (not shown) in alignment with the hole provided by the box structure of granite beams 20.

A test circuit carrier 78 is slidably mounted to move within the open slot 80 of the support plate 46. A guide rod 82 extends along one side of slot 80 to provide a track along which carrier 78 is manually moved. The corresponding end of carrier 78 includes a pair of axially aligned bearings 84 engaging guide rod 82. The opposite end of carrier 78 includes a roller 86 rotatably mounted on a shaft 88. Thus, when carrier 78 is slid inward or outward, bearings 84 slide on rod 82 while roller 86 rolls on an adjacent surface of support plate 46. Test circuit support carrier 88, together with the guiding structures providing for its movement, fits into a space within the thickness of "U"-shaped support plate 46. This arrangement allows the placement of granite beams 20 directly above and below support plate 46, and allows the unhindered motion of gantry structures 12 and probes.

Figure 6:
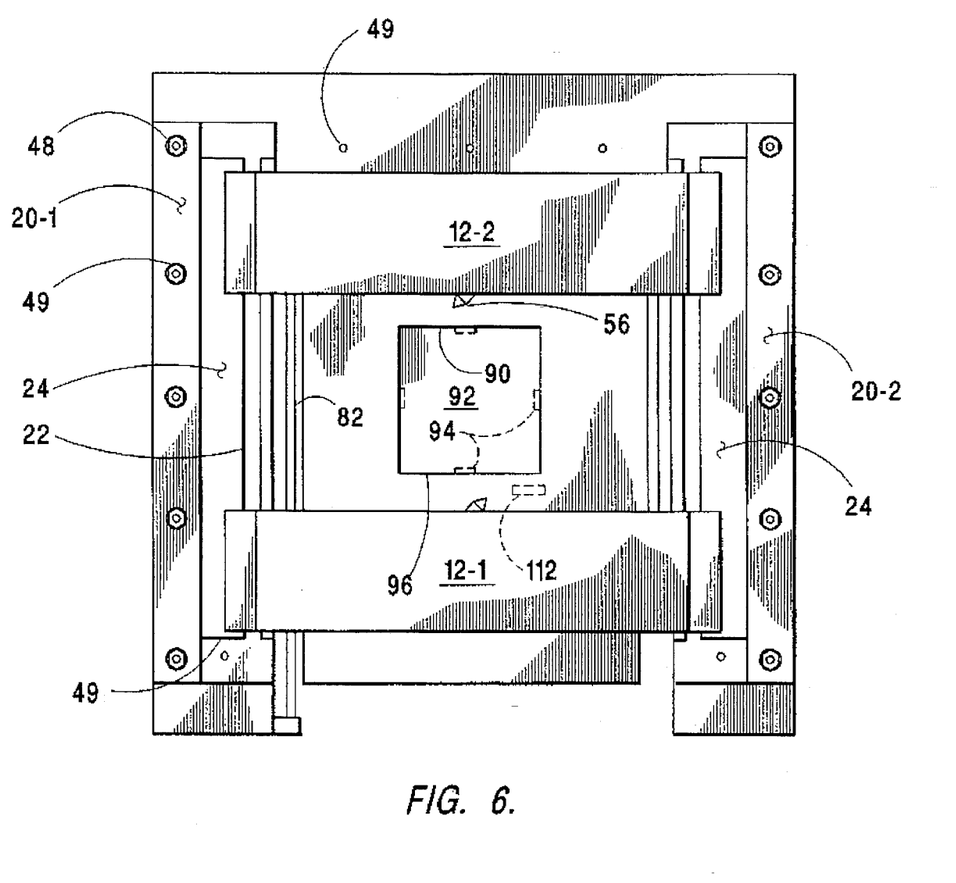
FIG. 6 is a plan view of the probing system of FIG. 1.

Referring to the plan view of FIG. 6, test circuit support carrier 78 additionally includes a central aperture 90, into which a circuit board 92 is placed to begin the test process. A number of ledges 94 project into central aperture 90 along the lower surface of carrier 78. Clamping means 96 may also be provided to hold the test circuit board 92 firmly in place within aperture 90 during the test process.

Referring again to FIG. 5, a macro-Z drive function is provided to move the probe carriers 58 of upper gantry structures 12-1 and 12-2 in the vertical Z-direction. This function is used to compensate for differences among circuit boards 92 to be tested in the system 10. Since all circuit boards 92 are installed within aperture 90 with their lower surfaces resting on ledges 94, this type of compensation is not needed for the probe carriers 58 of lower gantry structures 12-3 and 12-4. Thus, on each upper gantry structure 12-1 and 12-2, the probe carrier 58 is attached to a macro-Z stage 100, which slides on four posts 102 extending downward from a carriage 36. A Z-drive motor 104, attached to the carriage 36, turns a cam 106, engaging an adjacent lower surface 107 of macro-Z stage 100 to determine the vertical position of the stage 100.

Referring to FIGS. 5 and 6, a television camera assembly 110 is also located on a carriage 36, providing a means to view, for example, features of the circuit board 92 and features of the circuit support carrier 78. Reference marks placed on a reference surface 112 of test circuit support carrier 78 by both probe tips 60 operating on the same side of carrier 78 as the camera assembly 110 may be used to determine the locations of each such probe tip with respect to other features. Preferably, two such camera assemblies are provided for viewing the upper and lower sides of the carrier 78 for this calibration process.

The circuit testing process begins when the operator pulls carrier 78 outward to insert a circuit board 92 to be tested into aperture 90. The distance through which carrier 78 may be pulled is limited by the distance through which bearings 84 may slide on guide rod 82. When carrier 78 is fully extended outward in this way, central aperture 90 is moved to clear other structures of the probing system 10. When test circuit board carrier 78 is moved back inward, it is held against stopping surfaces, preventing further motion during the circuit testing process. Various procedures are then performed, with the four gantry structures 12 being moved by electrical currents applied to their associated linear motor coils 20, and with the four probe carriers 58 also being moved by means of electrical currents applied to their respective carriage linear motor coils 40. During these movements, the positions of gantry structures 12 are tracked by means of output signals from encoder read heads 32 moving in close proximity to corresponding encoder scales 26, and the positions of carriages 36 are tracked by means of outputs from encoder read heads (not shown) mounted thereon moving in close proximity to corresponding encoder scales 44. The first of these procedures may be the calibration of the system 10 relative to upper and lower surfaces of the circuit board 92. As physical contact is subsequently established between the four probes 60 and particular locations on circuit board 92, various circuits electrically connected to the probes 60 are used to determine various electrical characteristics of the traces or circuits on this board 92. The motion provided by each coil 66 is used to establish and break physical contact between each probe 60 and the circuit board 92. When these processes are completed, the operator pulls the circuit carrier 78 outward to remove circuit board 92.

The box shaped structure of granite beams 20 provides an open core through which various components of prober system 10 may be viewed and serviced. The gantry structures 12 may be moved into this core to facilitate servicing their components. Of particular importance is the ability to reach the area below a probe assembly 56 mounted on an upper gantry structure 12-1 or 12-2, or above a probe assembly 56 mounted on a lower gantry structure 12-3 or 12-4. These assemblies 56 must be removed for replacement and repair when their probes 60 become worn or otherwise damaged. Furthermore, circuit board 92 is fully visible in its test position.

The frame 14 formed with granite beams 20, support plate 46, and compression bolt assemblies 48 and 49 is thus an open structure providing particular rigidity along the sides where gantry structures 12 are supported and driven. The choice of perpendicular directions of gantry carriage motion on opposite sides of circuit board 92 provides a configurational advantage in allowing each of the granite beams 20 to function both as a rail for gantry support and as a structural member of frame 14.

While a configuration using two gantry structures 12 on each side of the circuit board 92 has been described, it is understood that a single gantry structure, or three or more gantry structures could alternately be used in this way. While the choice of perpendicular directions of gantry motion provides a configurational advantage as described above, it is understood that parallel directions of motion on each side of circuit board 92 could be provided by a prober system built in accordance with the invention with two additional granite beams providing the rail functions on one side of the circuit board 92. Thus, while the invention has been described in its preferred form or embodiment with some degree of particularity, it is understood that this description has been given only by way of example and that numerous changes in the details of construction, fabrication and use, including the combination and arrangement of parts, may be made without departing from the spirit and scope of the invention.

What is claimed is:

1. Apparatus moving probing devices along opposite sides of a circuit board under test, said apparatus comprising:

a support structure with a circuit board receiving opening;

circuit board holding means for holding said circuit board within said circuit board receiving opening with a first side of said circuit board exposed in a first direction and with a second side of said circuit board, opposite said first side, exposed in a second direction;

a first rail structure extending along a first side of said of said circuit board receiving opening, fastened to said support structure to extend therefrom in said first direction;

a second rail structure extending along a side of said circuit board receiving opening opposite said first side thereof, said second rail structure extending parallel to said first rail structure, fastened to said support structure to extend therefrom in said first direction;

a third rail structure extending along a second side of said circuit board receiving opening, fastened to said support structure to extend therefrom in said second direction;

a fourth rail structure extending parallel to said third rail structure, fastened to said support structure to extend therefrom in said second direction, wherein said first, second, third and fourth rail structures are fastened together to form a frame around a central opening, with said support structure extending within said central opening;

a first gantry structure including a first bearing structure movable along said first rail structure in engagement with said first rail structure and a second bearing structure movable along said second rail structure in engagement with said second rail structure, wherein said first gantry structure extends between said first and second bearing structures, across said circuit board receiving opening, adjacently disposed from said circuit board receiving opening in said first direction;

a second gantry structure including a third bearing structure movable along said third structure in engagement with said third rail structure and a fourth bearing structure movable along said fourth rail structure in engagement with said fourth rail structure, wherein said second gantry structure extends between said third and fourth bearings structures, across said circuit board receiving opening, adjacently disposed from said circuit board receiving opening in said second direction;

gantry drive means for moving said first and second gantry structures; and a probe mounted on each said first and second gantry structure to move toward and away from said circuit board held within said circuit board holding means.

2. The apparatus of claim 1, comprising in addition:

a first carriage movable along said first gantry structure between said first and second bearing structures, with a first said probe movably mounted on said first carriage;

first carriage drive means for moving said first carriage along said first gantry structure;

a second carriage movable along said second gantry structure between said third and fourth bearing structures, with a second said probe movably mounted on said second carriage; and second carriage drive means for moving said second carriage along said second gantry structure.

3. The apparatus of claim 1:

wherein said third rail structure extends in a direction perpendicular to said first rail structure; and wherein said rail structures are fastened together to form a rectangular frame around said central opening.

4. The apparatus of claim 3:

wherein each said rail structure includes a granite structural section and a steel rail section; and wherein each said gantry structure includes a bearing at each end engaging an adjacent said rail section.

5. The apparatus of claim 4, wherein said gantry drive means includes:

a linear motor magnet channel extending along each said rail structure parallel to said steel rail section;

a linear motor coil extending from each end of said first gantry structure, moving within adjacent linear motor magnet channels extending along said first and second rail structures;

a linear motor coil extending from each end of said second gantry structure, moving within adjacent linear motor magnet channels extending along said second and third rail structures;

a first encoder scale extending along said first rail structure parallel to said steel rail section thereon;

a second encoder scale extending along said third rail structure parallel to said steel rail section thereon;

a first encoder read head mounted on said first gantry section to move in proximity to said first encoder scale; and a second encoder read head mounted on said second gantry section to move in proximity to said second encoder scale.

6. The apparatus of claim 5, additionally comprising:

a third gantry structure including a fifth bearing structure movable along said first rail structure in engagement with said first rail structure and a sixth bearing structure movable along said second rail structure in engagement with said second rail structure, wherein said third gantry structure extends between said fifth and sixth bearing structures, across said circuit board receiving opening, adjacently disposed from said circuit board receiving opening in said first direction;

a fourth gantry structure including a seventh bearing structures movable along said third structure, in engagement with said third rail structure and an eighth bearing structure movable along said fourth rail structure in engagement with said fourth rail structure, wherein said fourth gantry structure extends between said seventh and eighth bearing structures, across said circuit board receiving opening, adjacently disposed from said circuit board receiving opening in said second direction;

a probe mounted on each said third and fourth gantry structure to move toward and away from said circuit board held within said circuit board holding means;

a linear motor coil extending from each end of said third gantry structure, moving within adjacent linear motor magnet channels extending along said first and second rail structures;

a linear motor coil extending from each end of said fourth gantry structure, moving within adjacent linear motor magnet channels extending said third and fourth rail structures;

a third encoder read head mounted on said third gantry section to move in proximity to said first encoder scale; and a fourth encoder read head mounted on said fourth gantry section to move in proximity to said second encoder scale.

7. The apparatus of claim 6, comprising in addition:

a third carriage movable along said third gantry structure between said fifth and sixth bearing structures, with a third said probe movably mounted on said third carriage;

third carriage drive means for moving said third carriage along said third gantry structure;

a fourth carriage movable along said fourth gantry structure between said seventh and eighth bearing structures, with a fourth said probe movably mounted on said fourth carriage; and fourth carriage drive means for moving said fourth carriage along said fourth gantry structure.

8. The apparatus of claim 3, wherein said circuit board holding means includes a circuit board carrier mounted to slide within said circuit board receiving opening between a first position in which said circuit board can be loaded into said circuit board carrier outside said rectangular frame and a second position in which said circuit board is held within said central opening.

9. Apparatus moving probing devices along opposite sides of a circuit board under test, said apparatus comprising:

a circuit board holder, holding said circuit board in a test position with a first side thereof exposed in a first direction and a second side thereof exposed in a second direction;

an open frame extending around said circuit board in said test position, said open frame including first and second rail structures extending in said first direction beyond said circuit board in a test position, said open frame additionally including third and fourth rail structures extending in said second direction beyond said circuit board in a test position, said second rail structure lying parallel to said first rail structure, said fourth rail structure lying parallel to said third rail structure;

a first gantry structure extending between said first and second rail structures, including a first bearing structure movable along said first rail structure in engagement with said first rail structure and a second bearing structure movable along said second rail structure in engagement with said second rail structure;

a second gantry structure extending between said third and fourth rail structures, including a third bearing structure movable along said third rail structure in engagement with said third rail structure and a fourth bearing structure movable along said fourth rail structure in engagement with said fourth rail structure;

first gantry drive means for moving said first gantry structure along adjacent said first side of said circuit board held within said circuit board holder;

second gantry drive means for moving said second gantry structure along adjacent said second side of said circuit board held within said circuit board holder;

a probe on said first gantry structure between said first and second bearing structures, mounted to move toward and away from said circuit board held within said circuit board holder; and a second probe on said second gantry structure between said third and fourth bearing structures, mounted to move toward and away from said circuit board held within said circuit board holder.

10. The apparatus of claim 9, wherein said third rail structure lies perpendicular to said first rail structures.

11. The apparatus of claim 10:

wherein each said rail structure includes a granite structural section and a rail section;

wherein said first and second gantry structures each include a bearing at each end moving on an adjacent said rail section; and wherein said granite structural sections within said first and second rail structures are attached at corners thereof to said granite structural sections within said third and fourth rail structures.

12. The apparatus of claim 11, wherein said granite structural sections within said first and second structures are attached to said granite structural sections within said third and fourth rail structures by means of compression bolt assemblies.

13. The apparatus of claim 10:

wherein said first gantry drive means includes first linear motor magnet channels extending along said first and second rail structures and first linear motor coils extending from said first gantry structure to move within said first linear motor magnet channels; and wherein said second gantry drive means includes second linear motor magnet channels extending along said third and fourth rail structures and second linear motor coils extending from said second gantry structure to move within said second motor magnet channels.

14. The apparatus of claim 13, comprising in addition:

a third gantry structure extending between said first and second rail structures, including a fifth bearing structure movable along said first rail structure in engagement with said first rail structure and a sixth bearing structure movable along said second rail structure in engagement with said second rail structure;

a fourth gantry structure extending between said third and fourth rail structures, including a seventh bearing structure movable along said third rail structure and an eighth bearing structure movable along said fourth rail structure;

third gantry drive means for moving said first gantry structure along adjacent said first side of said circuit board held within said circuit board holder, said third gantry drive means including third linear motor coils extending from said third gantry structure to move within said first linear motor magnet channels;

fourth gantry drive means for moving said fourth gantry structure along adjacent said second side of said circuit board held within said circuit board holder, said fourth gantry drive means including fourth linear motor coils extending from said fourth gantry structure to move within said second linear motor magnet channels; and a probe on said third gantry structure between said fifth and sixth bearing structures, mounted to move toward and away from said circuit board held within said circuit board holder;

a probe on said fourth gantry structure between said seventh and eighth bearing structures, mounted to move toward and away from said circuit board held within said circuit board holder.

15. The apparatus of claim 14:

wherein a first carriage is mounted to travel along said first gantry structure between said first and second bearing assemblies, with a first probe mounted on said first carriage;

wherein a second carriage is mounted to travel along said second gantry structure between said third and fourth bearing assemblies, with a second probe mounted on said second carriage;

wherein a third carriage is mounted to travel along said third gantry structure between said fifth and sixth bearing assemblies, with a third probe mounted on said third carriage; and wherein a fourth carriage is mounted to travel along said fourth gantry structure between said seventh and eighth bearing structures, with a fourth probe mounted on said fourth carriage.

16. The apparatus of claim 10, wherein said circuit board holder includes:

a support plate including a carrier slot, said support plate extending between said first and second rail structures on a first side of said support plate, and said third and fourth rail structures on a second side of said support plate; and a circuit board carrier, including a circuit board aperture, said circuit board carrier being mounted within said carrier slot to slide between a first position in which said circuit board may be inserted into, or removed from, said circuit board aperture outside said open frame, and a second position, in which said circuit board is held within said open frame.

17. Apparatus for moving probing devices along both sides of a circuit board under test, said apparatus comprising:

circuit board holding means for holding said circuit board in a test position;

a frame surrounding said circuit board in said test position, said frame including a first aperture adjacent a first side of said circuit board and a second aperture adjacent a second side of said circuit board, said second side of said circuit board being opposite said first side thereof, said frame also including first rails extending along opposite sides of said first aperture and second rails extending along opposite sides of said second aperture;

a first gantry structure extending between said first rails, engaging said first rails, and driven along said first rails;

a second gantry structure extending between said second rails, engaging said second rails, and driven along said second rails;

a first carriage driven along said first gantry structure adjacent said first side of said circuit board in a direction perpendicular to a direction in which said first gantry structure is driven;

a second carriage driven along said second gantry structure adjacent said second side of said circuit board in a direction perpendicular to a direction in which said second gantry structure is driven;

a first test probe mounted to said first carriage; and a second test probe mounted to said second carriage.

18. The apparatus of claim 17, wherein said second rails extend perpendicularly to said first rails.

19. The apparatus of claim 18, additionally comprising:

a third gantry structure extending between said first rails, engaging said first rails, and driven along said first rails;

a fourth gantry structure extending between said second rails, engaging said second rails, and driven along said second rails;

a third carriage driven along said third gantry structure adjacent said first side of said circuit board in a direction perpendicular to a direction in which said first gantry structure is driven;

a fourth carriage driven along said fourth gantry structure adjacent said second side of said circuit board in a direction perpendicular to a direction in which said second gantry structure is driven;

a third test probe mounted to said third carriage; and a fourth test probe mounted to said fourth carriage.

20. The apparatus of claim 19, additionally comprising:

probe engaging means for driving each said test probe into engagement with an adjacent surface of said circuit board held within said circuit board holding means;

means for holding said second side of said circuit board against ledges in said circuit board holding means;

first macro drive means for adjusting a first offset distance between said first test probe and said first side of said circuit board; and second macro drive means for adjusting a second offset distance between said third test probe and said first side of said circuit board.

\* \* \* \* \*